(12) United States Patent
Mentovich et al.

(10) Patent No.: US 10,497,410 B2
(45) Date of Patent: Dec. 3, 2019

(54) HIGH-DENSITY MEMORY MACRO

(71) Applicants: Mellanox Technologies, Ltd., Yokneam (IL); Bar-Ilan University, Ramat-Gan (IL)

(72) Inventors: Elad Mentovich, Tel-Aviv (IL); Narkis Geuli, Ein HaEmek (IL); Robert Giterman, Beer-Sheva (IL); Alexander Fish, Tel-Mond (IL); Adam Teman, Lausanne (CH)

(73) Assignees: MELLANOX TECHNOLOGIES, LTD., Yokneam (IL); BAR-ILAN UNIVERSITY, Ramat Gan (IL)

( * ) Notice: Subject to any disclaimer, the term of this patent is extended or adjusted under 35 U.S.C. 154(b) by 0 days.

(21) Appl. No.: 16/121,672

(22) Filed: Sep. 5, 2018

(65) Prior Publication Data

US 2019/0074040 A1    Mar. 7, 2019

Related U.S. Application Data

(60) Provisional application No. 62/555,107, filed on Sep. 7, 2017.

(51) Int. Cl.
*G11C 7/10* (2006.01)
*G11C 16/06* (2006.01)
(Continued)

(52) U.S. Cl.
CPC ............ *G11C 7/1057* (2013.01); *G11C 5/025* (2013.01); *G11C 7/109* (2013.01); *G11C 8/08* (2013.01);
(Continued)

(58) Field of Classification Search
CPC ....... G11C 7/1057; G11C 5/025; G11C 7/109; G11C 8/08; G11C 11/403; G11C 11/405;
(Continued)

(56) References Cited

U.S. PATENT DOCUMENTS

| 6,043,638 A | * | 3/2000 | Tobita | G05F 3/247 323/312 |
| 8,654,575 B2 | * | 2/2014 | Deng | G11C 11/412 365/154 |

(Continued)

OTHER PUBLICATIONS

Somasekhar et al., "2 GHz 2 Mb 2T gain cell memory macro with 128 GBytes/sec bandwidth in a 65 nm logic process technology", IEEE Journal of Solid-State Circuits, vol. 44, No. 1, pp. 174-185, Jan. 2009.

(Continued)

*Primary Examiner* — Ly D Pham
(74) *Attorney, Agent, or Firm* — Kligler & Associates

(57) ABSTRACT

A high-density memory includes: a data write interface, a data read interface, an array of memory cells and level-shifting write drivers. The data write interface inputs data written to the memory. The data read interface outputs data read from the memory. The array of memory cells stores data input at the data write interface and outputs stored data to the data read interface. Each of the memory cells includes at least one low threshold voltage (LVT) read transistor and at least one respective regular threshold voltage (RVT) transistor, so as to obtain high-speed read operations. The level-shifting write drivers supply shifted write wordline voltages to the array, so as to obtain high-speed write operations.

11 Claims, 9 Drawing Sheets
(8 of 9 Drawing Sheet(s) Filed in Color)

(51) Int. Cl.
*G11C 16/04* (2006.01)
*G11C 11/4097* (2006.01)
*G11C 11/403* (2006.01)
*G11C 5/02* (2006.01)
*G11C 8/08* (2006.01)
*G11C 11/4096* (2006.01)
*G11C 11/405* (2006.01)
*G11C 11/412* (2006.01)

(52) U.S. Cl.
CPC .......... *G11C 11/403* (2013.01); *G11C 11/405* (2013.01); *G11C 11/4096* (2013.01); *G11C 11/4097* (2013.01); *G11C 11/412* (2013.01)

(58) Field of Classification Search
CPC ............ G11C 11/4096; G11C 11/4097; G11C 11/412
USPC ........................................................ 365/200
See application file for complete search history.

(56) References Cited

U.S. PATENT DOCUMENTS

| | | | |
|---|---|---|---|
| 9,691,445 B2 | 6/2017 | Giterman et al. | |
| 2002/0001215 A1* | 1/2002 | Fujisawa ................ | G11O 5/025 365/51 |
| 2004/0174736 A1* | 9/2004 | Takemura ............. | G11C 11/412 365/154 |
| 2005/0030782 A1* | 2/2005 | Takahashi .............. | G11C 14/00 365/145 |
| 2005/0232058 A1* | 10/2005 | Yabe .................... | G11C 11/412 365/230.03 |
| 2007/0025170 A1* | 2/2007 | Barth, Jr. ................ | G11C 7/02 365/208 |
| 2007/0035986 A1* | 2/2007 | Houston .............. | G11C 7/1051 365/154 |
| 2015/0070970 A1* | 3/2015 | Inaba ...................... | G11C 8/08 365/148 |

OTHER PUBLICATIONS

Chun et al., "A 667 MHz logic compatible embedded DRAM featuring an asymmetric 2T gain cell for high speed on-die caches", IEEE Journal of Solid-State Circuits, vol. 47, No. 2, pp. 547-559, Feb. 2012.
ITRS, "International Technology Roadmap for Semiconductors 2.0", 79 pages, year 2015.
Park et al., "Low-power high throughput LDPC decoder using non-refresh embedded DRAM", IEEE Journal of Solid-State Circuits, vol. 49, No. 3, pp. 783-794, Mar. 2014.
Giterman et al., "4T gain-cell with internal-feedback for ultra-low retention power at scaled CMOS nodes", IEEE International Symposium on Circuits and Systems (ISCAS), pp. 2177-2180, Jun. 1-5, 2014.
Gupta et al., "Underdesigned and opportunistic computing in presence of hardware variability", IEEE Transactions on Computer-Aided Design of integrated circuits and systems, vol. 32, No. 1, pp. 8-23, Jan. 2013.
Sampson et al., "Approximate storage in solid-state memories", Micro'46, 12 pages, Dec. 7-11, 2013.
Lucas et al., "Sparkk: Quality25 scalable approximate storage in dram", The Memory Forum, 6 pages, Jun. 10, 2014.
Ganapathy et al., "Approximate computing with unreliable dynamic memories", IEEE 13th International New Circuits and Systems Conference (NEWCAS), pp. 1-4, year 2015.
Edri et al., "Silicon proven 30 per-cell retention time distribution model of gain-cell based eDRAM", IEEE Transactions on Circuits and Systems, vol. 63, No. 2, pp. 222-232, Feb. 2016.

* cited by examiner

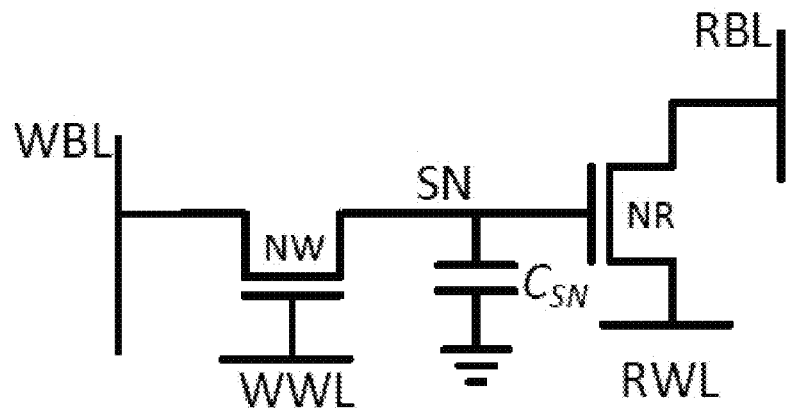
FIGURE 1 – Prior Art
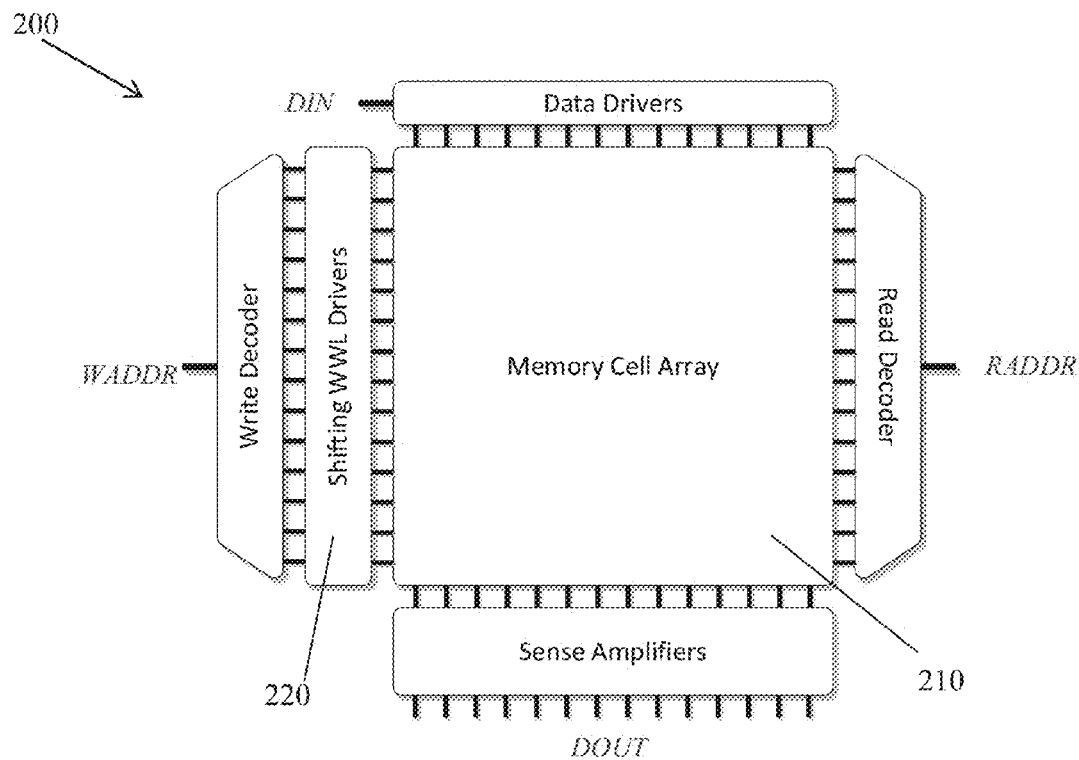
FIGURE 2

HIGH-DENSITY MEMORY MACRO

RELATED APPLICATION/S

This application claims the benefit of priority under 35 USC § 119(e) of U.S. Provisional Patent Application No. 62/555,107 filed on Sep. 7, 2017, the contents of which are incorporated by reference as if fully set forth herein in their entirety.

FIELD AND BACKGROUND OF THE INVENTION

The present invention, in some embodiments thereof, relates to a high density memory and, more particularly, but not exclusively, to a high density memory macro for high bandwidth applications.

In light of the growing demands for high-density embedded memories in modern microprocessors and other VLSI System-on-Chip (SoC) designs [1], embedded DRAM (GC-eDRAM) has emerged as an alternative to static random access memory (SRAM) due to its high-density, non-destructive read operation, low leakage power, and two-port operation [2]-[5]. However, this technology requires periodic refresh cycles to reliably retain data, which reduces the memory availability and consumes dynamic refresh power. While GC-eDRAM implementations in mature technology nodes, such as 90 nm and 65 nm, provide long data retention times (DRTs), sub-65 nm technologies suffer from much shorter DRTs due to the reduced parasitic storage capacitances and increased leakage currents [2]-[5].

The conventional and smallest version of a GC-eDRAM is based on the two transistor (2T) bitcell illustrated in FIG. 1. The 2T bitcell is composed of a write port, including a write transistor (NW), a write word-line (WWL), and a write bit-line (WBL); a read port, including a read transistor (NR), a read wordline (RWL), and a read bit-line (RBL); together yielding a bitcell with storage node (SN) capacitance $C_{SN}$. While the 2T bitcell demonstrated sufficient DRTs in mature technology nodes, it suffers from much lower DRTs in deeply-scaled nodes (below 65 nm) due to reduced parasitic storage capacitances and increased leakage currents.

Additional background art includes:

[1] ITRS, "International Technology Roadmap for Semiconductors—2015 Edition," 2015. [Online]. Available: http://www(dot)itrs2(dot)net

[2] D. Somasekhar, Y. Ye, P. Aseron, S.-L. Lu, M. M. Khellah, J. Howard, G. Ruhl, T. Karnik, S. Borkar, V. K. De et al., "2 GHz 2 Mb 2T gain cell memory macro with 128 GBytes/sec bandwidth in a 65 nm logic process technology," IEEE J. Solid-State Circuits, vol. 44, no. 1, pp. 174-185, 2009.

[3] K. C. Chun, P. Jain, T.-H. Kim, and C. H. Kim, "A 667 MHz logic compatible embedded DRAM featuring an asymmetric 2T gain cell for high speed on-die caches," IEEE J. Solid-State Circuits, vol. 47, no. 2, pp. 547-559, 2012.

[4] Y. S. Park, D. Blaauw, D. Sylvester, and Z. Zhang, "Low-power high throughput LDPC decoder using non-refresh embedded DRAM," IEEE Journal of Solid-State Circuits, vol. 49, no. 3, pp. 783-794, 2014.

[5] R. Giterman, A. Teman, P. Meinerzhagen, A. Burg, and A. Fish, "4T gain-cell with internal-feedback for ultra-low retention power at scaled CMOS nodes," in Proc. of IEEE Int. Symp. on Circuits and Systems (ISCAS) 2014. IEEE, 2014, pp. 2177-2180.

[6] P. Gupta, Y. Agarwal, L. Dolecek, N. Dutt, R. K. Gupta, R. Kumar, S. Mitra, A. Nicolau, T. S. Rosing, M. B. Srivastava et al., "Underdesigned and opportunistic computing in presence of hardware variability," IEEE Transactions on Computer-Aided Design of integrated circuits and systems, vol. 32, no. 1, pp. 8-23, 2013.

[7] A. Sampson, J. Nelson, K. Strauss, and L. Ceze, "Approximate storage in solid-state memories," ACM Transactions on Computer Systems (TOCS), vol. 32, no. 3, p. 9, 2014.

[8] J. Lucas, M. Alvarez-Mesa, M. Andersch, and B. Juurlink, "Sparkk: Quality-scalable approximate storage in dram," in The Memory Forum, 2014, pp. 1-9.

[9] S. Ganapathy, A. Teman, R. Giterman, A. Burg, and G. Karakonstantis, "Approximate computing with unreliable dynamic memories," in New Circuits and Systems Conference (NEWCAS), 2015 IEEE 13th International. IEEE, 2015, pp. 1-4.

[10] N. Edri, P. Meinerzhagen, A. Teman, A. Burg, and A. Fish, "Silicon proven per-cell retention time distribution model of gain-cell based eDRAM," IEEE Trans. Circuits Syst. I, vol. 63, no. 2, pp. 222-232, February 2016.

[11] U.S. Pat. No. 9,691,445.

SUMMARY OF THE INVENTION

Embodiments of a memory suitable for deeply scaled CMOS technologies (below 65 nm) and/or high-bandwidth applications are presented herein. The memory includes features designed to overcome the disadvantages of operating at highly-scaled process technologies and/or at very high frequencies.

As described in more detail below, embodiments of the high-density memory and memory macro described herein include an array of mixed threshold memory cells which provide high speed in-cell readout by using low threshold voltage (LVT) transistors. Level-shifting write drivers provide improved write in terms of both speed and level passing.

Optional embodiments of the memory include one or more additional elements, including but not limited to:

a) High speed differential sense amplifier;

b) Configurable reference voltage for differential sensing;

c) High speed wordline drivers for readout with extra pull-down devices for enhanced read speed. Optionally, the pull-down devices are inserted between some columns of the array (e.g. every 16 columns), thus reducing the pull-down delay of the RWL of selected rows, resulting in a faster RBL discharge for memory cells storing a '1';

d) Level shifting is achieved in parallel with decoder delay to reduce propagation delay; and e) Predecoding for reduced propagation delay within small row pitch.

Optionally the memory is an embedded memory. Further optionally the memory is an eDRAM, for example a GC-eDRAM. It is noted that for clarity some embodiments are described herein as GC-eDRAM. However these embodiments do not limit the scope of the invention to GC-eDRAM; the memory may be implemented in other technologies.

Optional embodiments of the memory are based on an array of four transistor (4T) bitcells which include at least two transistors with different threshold voltage (denoted herein a mixed threshold 4T bitcell or a 4T mixed-VT bitcell).

Some embodiments of the memory are fully logic-compatible and comply with standard digital logic process technologies. These technologies include, but are not limited to, Complementary Metal-Oxide Semiconductor (CMOS), Fully Depleted Silicon on Insulator (FD-SOI) and Fin Field Effect Transistor (FinFET). For example, some embodiments of the memory may be CMOS-based and comply with standard Bulk technology digital design rules without incurring special process steps.

Embodiments of the high-density memory embodiments herein provide the following advantages:

a) Small bitcell size—optionally the bitcells are GC-eDRAM having 2-5 transistors;
b) High utilization of peripherals—less than 30% of the macrocell size; and
c) Small per-row level conversion with single shared level shifter per array.

As used herein the terms "memory cell", "gain-cell" and "bitcell" mean a circuit that stores one bit of information.

Results are presented herein for operation of an exemplary embodiment of a memory macro at frequencies of up to 800 MHz at nominal supply (0.9V) in a 28 nm CMOS technology. The results demonstrate that the exemplary memory macro:

a) Has an over 90% array availability for sub-65 nm GC-eDRAM based memory;
b) Works over a temperature range of at least 0-85° C.;
c) Works at supply voltages from Near-threshold (0.6V @28 nm) to Nominal voltages (1V @28 nm); and
d) Works at above 500 MHz over portions of the voltage range.

The exemplary memory macro offers a 30% lower area and 30% power reduction over SRAM in the same technology, and operated above 500 MHz at supply voltages of 0.7 V-1.0 V.

According to an aspect of some embodiments of the present invention there is provided a high-density memory which includes: a data write interface, a data read interface, an array of memory cells and level-shifting write drivers. The data write interface inputs data written to the memory. The data read interface outputs data read from the memory. The array of memory cells stores data input at the data write interface and outputs stored data to the data read interface. Each of the memory cells includes at least one low threshold voltage (LVT) read transistor and at least one respective regular threshold voltage (RVT) transistor, so as to obtain high-speed read operations. The RVT transistors have larger threshold voltage than the threshold voltage of the LVT read transistor. The level-shifting write drivers supply shifted write wordline voltages to the array, so as to obtain high-speed write operations.

According to some embodiments of the invention, the memory cells are scaled below 65 nanometers.

According to some embodiments of the invention, the memory has separate write and read paths.

According to some embodiments of the invention, the memory further includes a shared level shifter adapted to supply a boosted voltage to the write drivers.

According to some embodiments of the invention, the memory further includes at least one high-speed differential sense amplifier adapted to detect a logic level of an output data signal based on a comparison with a reference voltage. According to some further embodiments of the invention, the reference voltage is configurable.

According to some embodiments of the invention, the memory further includes high-speed wordline drivers which include respective pull-down devices, so as to enhance read speed.

According to some embodiments of the invention, the level shifting is performed in parallel with decoder delay so as to reduce propagation delay.

According to some embodiments of the invention, the memory predecodes address signals so as to reduce propagation delay.

According to some embodiments of the invention, the memory operates at above 500 MHz.

According to some embodiments of the invention, the memory operates over a temperature range of 0-85° C.

According to some embodiments of the invention, the memory operates at supply voltages from near-threshold voltage to nominal voltage.

According to an aspect of some embodiments of the present invention there is provided a high-density memory which includes:

a data write interface adapted to input data written to the memory;
a data read interface adapted to output data read from the memory;
an array of memory cells associated with the data write interface and the data read interface, adapted to store data input at the data write interface and for outputting stored data to the data read interface, the memory cells comprising respective low threshold read elements so as to obtain high-speed read operations; and
level-shifting write drivers associated with the array of memory cells, adapted to supply shifted write wordline voltages to the array so as to obtain high-speed write operations.

According to some embodiments of the invention, the memory cells are scaled below 65 nanometers.

According to some embodiments of the invention, the memory is a dual-ported memory comprising separate write and read paths.

According to some embodiments of the invention, the memory further includes a single shared level shifter for the array.

According to some embodiments of the invention, the memory further includes a high-speed differential sense amplifier.

According to some embodiments of the invention, the differential sense amplifier is adapted to operate with a configurable reference voltage.

According to some embodiments of the invention, the memory further includes high-speed wordline drivers for readout with pull-down devices for enhanced read speed.

According to some embodiments of the invention, the level shifting is performed in parallel with decoder delay so as to reduce propagation delay.

According to some embodiments of the invention, the high-density memory reduces propagation delay by predecoding address signals.

According to some embodiments of the invention, the high-density memory is capable of operating at above 500 MHz.

According to some embodiments of the invention, the high-density memory is capable of operating over a temperature range of 0-85° C.

According to some embodiments of the invention, the high-density memory is capable of operating at supply voltages from near-threshold voltage to nominal voltage.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

The patent or application file contains at least one drawing executed in color. Copies of this patent or patent application publication with color drawings will be provided by the Office upon request and payment of the necessary fee.

Some embodiments of the invention are herein described, by way of example only, with reference to the accompanying drawings and images. With specific reference now to the drawings and images in detail, it is stressed that the particulars shown are by way of example and for purposes of illustrative discussion of embodiments of the invention. In this regard, the description taken with the drawings makes apparent to those skilled in the art how embodiments of the invention may be practiced.

Figure 3:
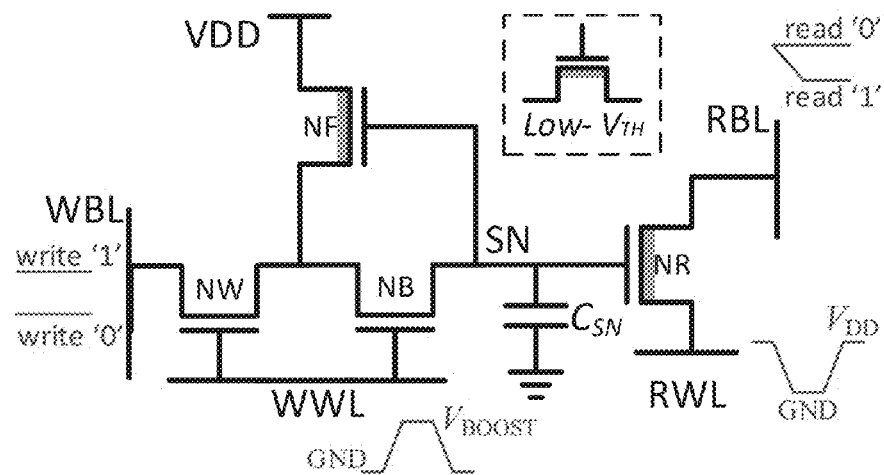

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

Figure 4:
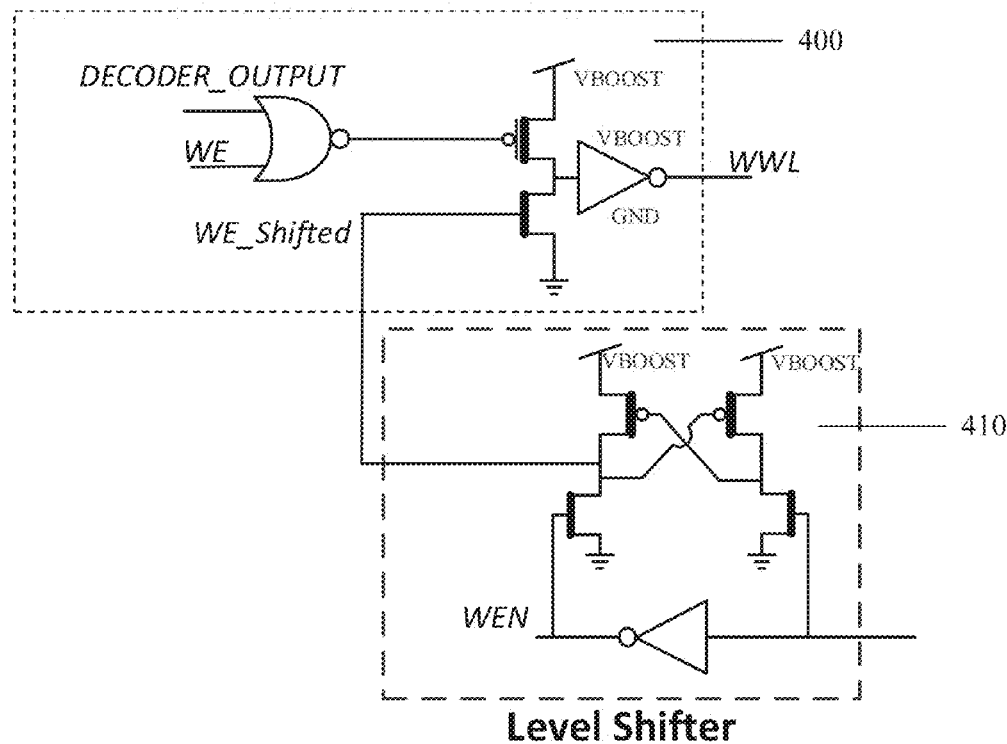
Figure 5:
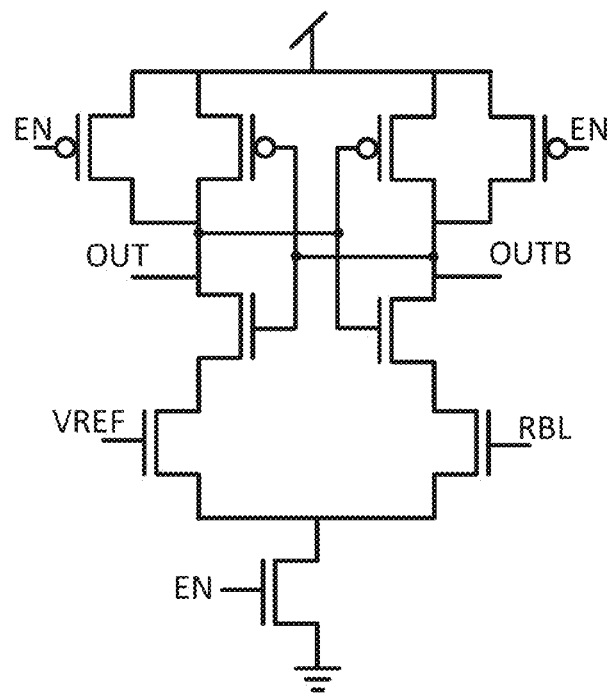
Figure 6:
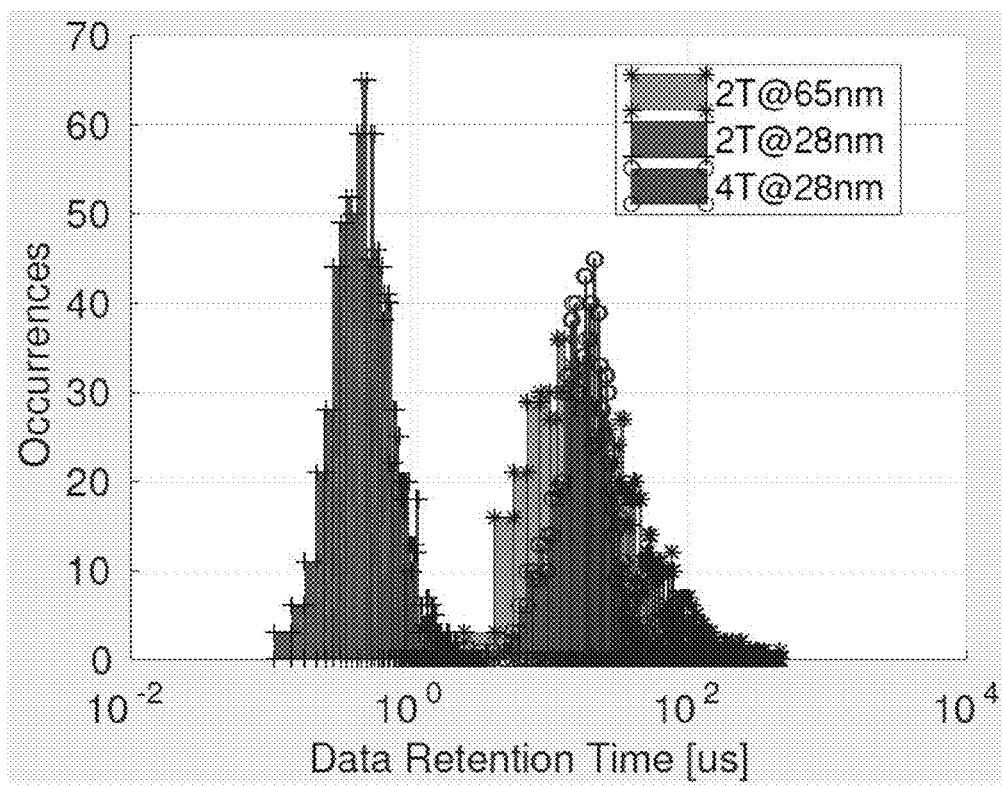
Figure 7:
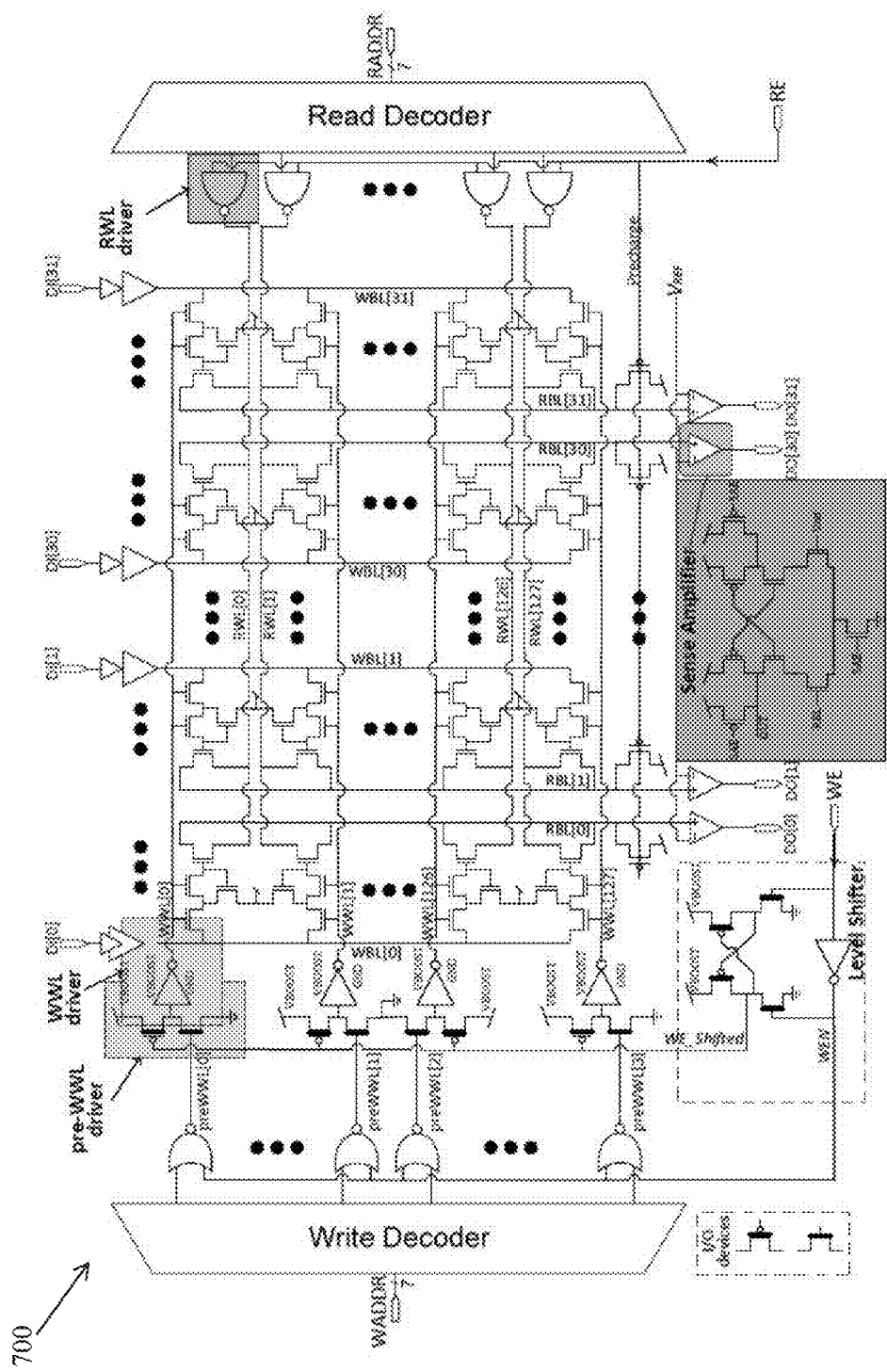
Figure 8:
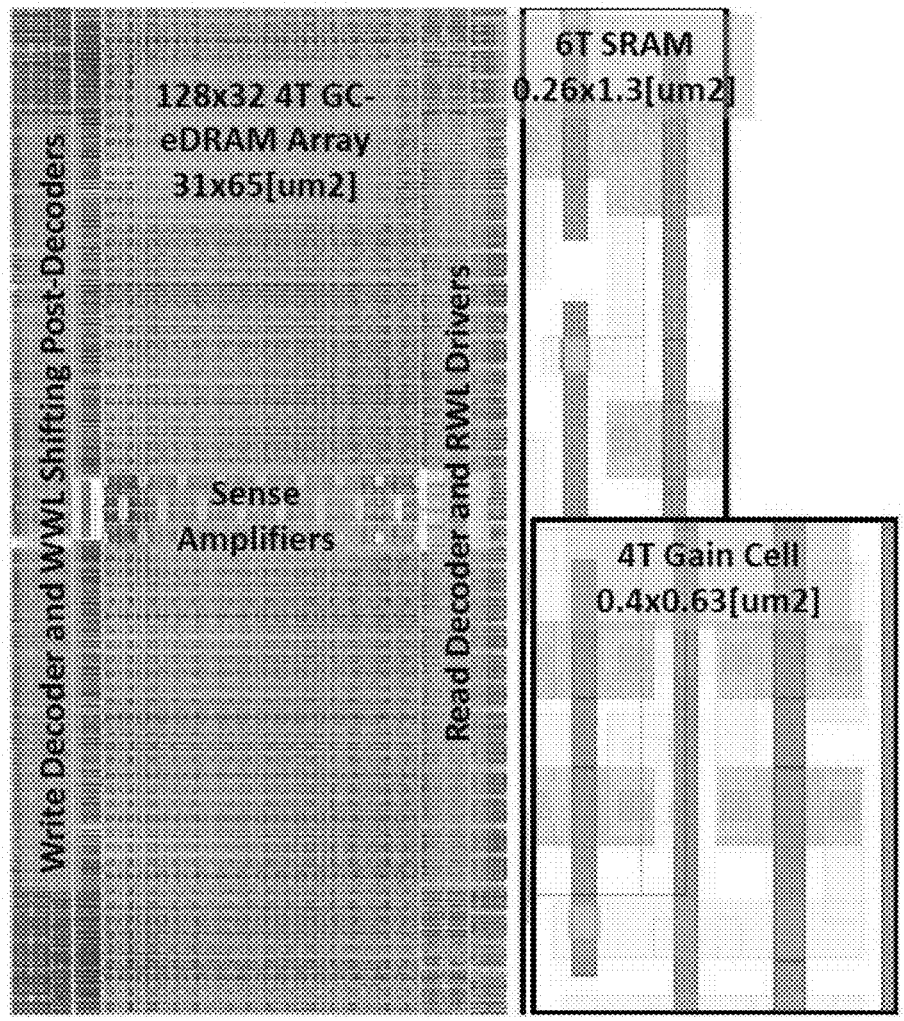
Figure 9:
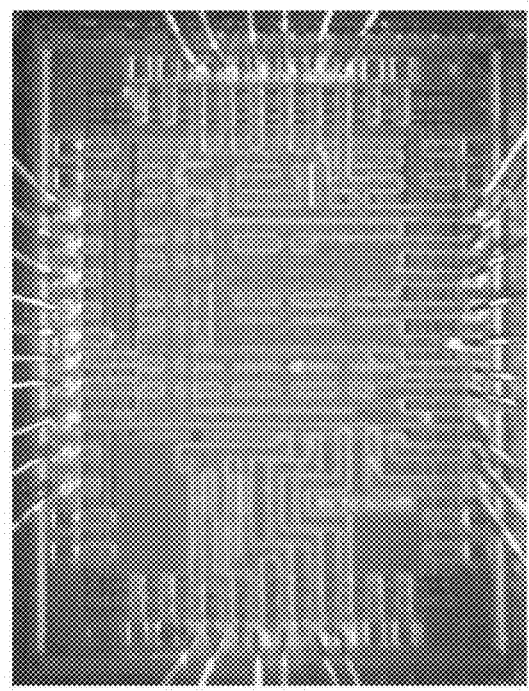
Figure 10:
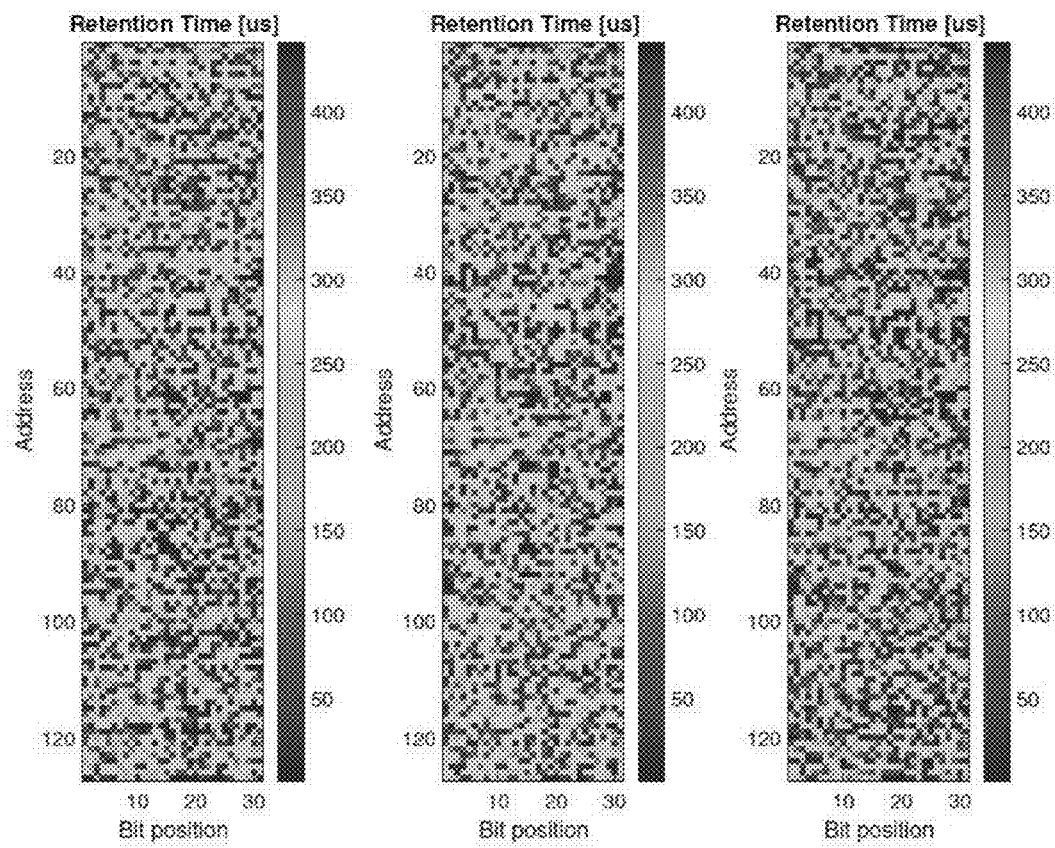
Figure 11:
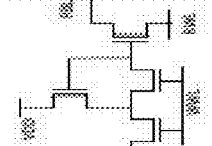
Figure 12:
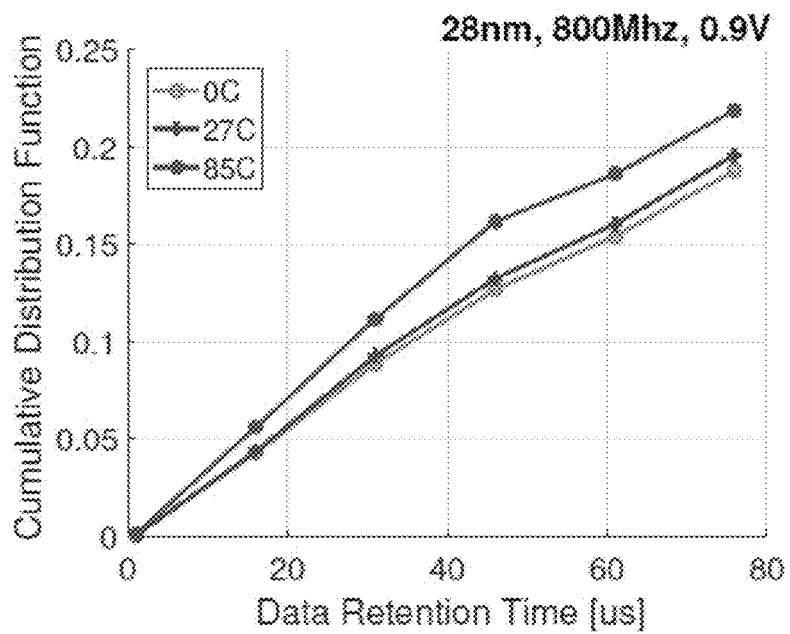
Figure 13:
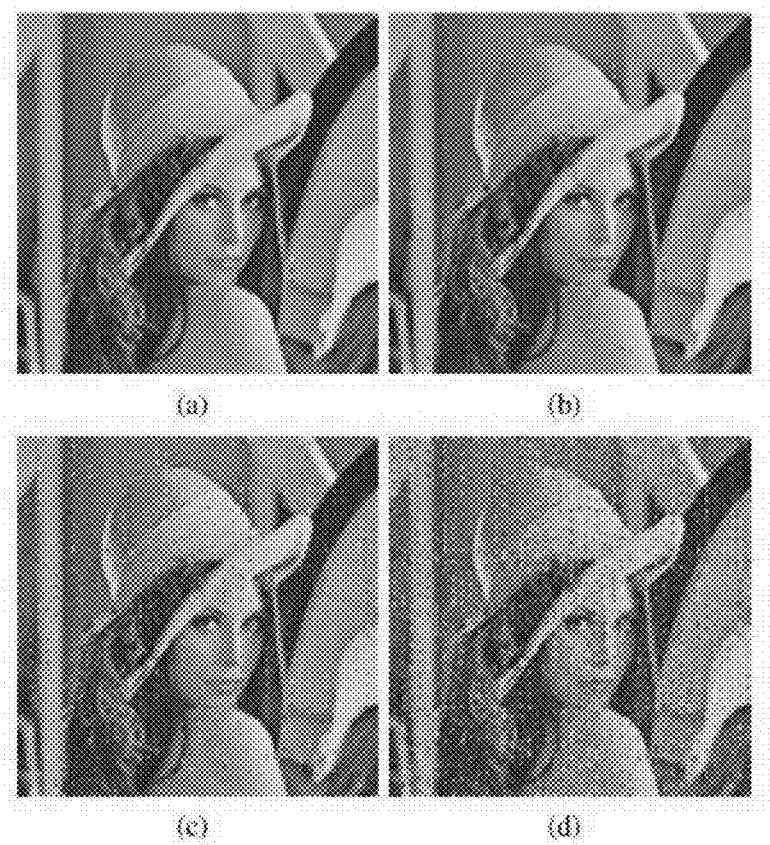

In the drawings:

FIG. 1 is a simplified circuit diagram of a two transistor (2T) bitcell;

FIG. 2 is a simplified block diagram of a memory, according to embodiments of the invention;

FIG. 3 is a simplified circuit diagram of a 4T mixed threshold gain-cell;

FIG. 4 is a simplified circuit diagram of a shifting WWL driver with a level shifter, according to exemplary embodiments of the invention;

FIG. 5 is a simplified circuit diagram of a sense amplifier according to exemplary embodiments of the invention;

FIG. 6 shows estimated retention time distributions for 2T and 4T bitcells;

FIG. 7 is a simplified circuit diagram a 4 kb (128×32) GC-eDRAM memory macro, based on the 4T mixed-VT bitcell, according to an exemplary embodiment of the invention;

FIG. 8 shows the layout views of an embodiment of a 4T mixed-VT NMOS bitcell, a 6T SRAM cell and an array of 4T mixed-VT NMOS bitcells;

FIG. 9 shows a micrograph and measured characteristics of a 28 nm test chip of an exemplary embodiment of the invention;

FIG. 10 shows the measured retention time maps of the 4 kb 4T gain-cell array according to an exemplary embodiment of the invention;

FIG. 11 shows a comparison of the 4T mixed-VT bitcell described herein and other logic-compatible embedded memory structures;

FIG. 12 shows the cumulative distribution function of the DRT at multiple temperatures; and FIG. 13 shows an image stored in a 4T GC-eDRAM memory macro according to an exemplary embodiment of the invention, at four different refresh rates.

DESCRIPTION OF SPECIFIC EMBODIMENTS OF THE INVENTION

The present invention, in some embodiments thereof, relates to a high density memory and, more particularly, but not exclusively, to a high density memory macro for high bandwidth applications.

Embodiments are presented herein for a high-density memory capable of high-speed write and read operations. The memory includes an array of mixed-threshold memory cells (also denoted herein the "memory cell array" or "array") which are accessed during write operations using level-shifting write drivers.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 2 is a simplified block diagram of a memory, according to embodiments of the invention. The architecture of memory 200 provides solutions to the difficulties encountered in memories implemented in highly-scaled technologies and/or operating at very high frequencies, as described in more detail below.

Memory 200 includes memory cell array 210 and level-shifting write drivers 220.

Optionally memory 200 further includes at least one of:
a) Write decoder(s);
b) Read decoder(s);
c) Data-in drivers; and
d) Sense amplifiers.

Exemplary embodiments of these components are described below.

As used herein the term "memory macro" means a memory containing multiple memory cells with a common interface to write data to the memory cells and to read data from the memory cells, according to a predefined communication protocol. The memory macro includes all required logical and physical views necessary for integration of the block within the standard digital ASIC design flow.

Memory Cell Array

Memory cell array 210 includes multiple dynamic memory cells (e.g. gain-cells). For clarity, embodiments are described herein for a non-limiting embodiment in which the memory cell array (also denoted herein an array of memory cells) is formed as an N×M array having N rows and M columns. However, embodiments with different constellations of memory cells are easily derived from the embodiments described herein.

Each memory cell includes a respective write element (e.g. write transistor), a respective read element (e.g. read transistor), and, optionally, other elements (e.g. the NF and NB transistors of the 4T mixed-VT gain-cell shown in FIG. 3), which are interconnected to form a storage node (SN).

Write is performed by enabling the write-word line (WWL) of the row, which enables the write element of the memory cells in the row and passes the data to the storage node. Read is performed by enabling the read-word-line (RWL) of the row, which conditionally discharges the read-bit line (RBL) of the column depending on the level stored in the cell.

Optionally, at least some of the memory cells in memory cell array 210 utilize internal feedback to increase the data retention time, in order to decrease the energy-costly refresh cycles. The internal feedback reduces the leakage from/to the storage node, and thereby extends the DRT and provides higher memory availability (i.e. the time the memory cell is not busy "refreshing").

In order to improve the access latency (speed) of the array, LVT transistors are used for the read element, allowing a faster charge/discharge of the RBL and faster read operation. The RVT transistors in the memory cell have reduced leakage current and reduced on-current, which results in slower operation relative to the LVT transistor.

In 28 nm technology, typical ranges for the threshold voltage of RVT and LVT transistors are 500 mV-600 mV and 300 mV-400 mV respectively. The nominal voltage for 28 nm technology is 900 mV. The term "near-threshold" refers to the voltage region of operation which is close to the transistor's threshold voltage, typically in the range of 400 mV-600 mV in 28 nm technology.

Optionally, at least one of the memory cells is a mixed threshold memory cell.

As used herein the terms "mixed threshold memory cell" and "mixed threshold gain-cell" mean a memory cell which includes at least one LVT read transistor and at least one regular threshold voltage (RVT) transistor, where the magnitude of the threshold voltage of the RVT transistor is larger than the magnitude of the threshold voltage of the LVT transistor.

Reference is now made to FIG. 3, which is a simplified circuit diagram of a 4T mixed threshold gain-cell according to embodiments of the invention. NB and NF form an internal feedback loop that strengthens the weaker data level and extends the DRT. The feedback and read transistors (NF and NR) are LVT transistors, to enable a faster evaluation of the RBL voltage during read, resulting in a much faster read access time. The LVT NF transistor also strengthens the internal feedback of the cell, resulting in improved DRT characteristics.

Optionally, at least some of the memory cells in memory cell array 210 are 4T mixed threshold gain-cells.

It is noted that $C_{SN}$ indicates the capacitance at the storage node, which serves to retain the data at the storage node (SN). The presence of $C_{SN}$ in FIG. 3 is not intended to limit embodiments of the invention to memory cells which include a dedicated capacitor element within the memory cell.

Level-Shifting Write Drivers

Optionally, the memory includes at least one level-shifting write driver 400 (e.g. one level-shifting write driver per row of the memory cell array). Level-shifting write driver 400 (also denoted a shifting WWL driver) reduces the write latency of the memory by driving the large WWL capacitance of the gain-cell using dedicated level-shifters.

The row-wise driving level shifters supply a boosted voltage (above VDD or a negative voltage) to the WWL in order to improve its charge/discharge speed and enable a faster write operation. The boosted voltage is also denoted herein the shifted write wordline voltage.

Optionally, the boosted voltage is provided by level shifter 410, which receives an input signal at a voltage of GND/VDD and outputs a signal at a voltage of GND/VBOOST (or VNEGATIVE/VDD). Optionally the level shifter is shared by multiple rows of the memory (e.g. a single level shifter for the entire memory macro, as shown in FIG. 7).

In addition, using a boosted voltage enables passing "strong" '0' and '1' levels to the storage node due to a stronger overdrive voltage (|VGS−VT|) of the write element, and thereby extending the data retention time of the cell and improving the read access time.

Reference is now made to FIG. 4, which is a simplified circuit diagram of an exemplary level-shifting write driver 400 and level shifter (410), according to exemplary embodiments of the invention.

Optionally the memory includes multiple level-shifting write drivers (e.g. a respective write driver per row) and a single shared level shifter.

Sense Amplifiers

The access latency of memories is often dominated by the read cycle, which includes the charge/discharge of the large RBL capacitance based on the level stored in the cell.

Conventional single-ended memory cells (which output the stored data level without its complement) usually use a simple sense inverter as the sense amplifier. However, this incurs a long latency as the RBL needs to discharge to the switching threshold of the inverter in order to output the correct memory level.

Optionally, the memory includes at least one differential sense amplifier in order to reduce this latency. The differential sense amplifier performs a comparison between the RBL voltage and a reference voltage supplied to the memory (VREF) and amplifies the difference to GND/VDD.

By setting VREF to a level close to VDD (for example, 0.8 VDD) a faster evaluation may be reached as the RBL voltage swing is reduced.

Moreover, energy is saved because less charge needs to be transferred to the RBL capacitance.

Reference is now made to FIG. 5, which is a simplified circuit diagram of a sense amplifier according to exemplary embodiments of the invention.

Write and Read Decoders

Decoders are used in order to select one word-line during a write (WWL) or read (RWL) operation based on the input write and read address inputs.

Optionally, the memory includes separate write and read decoders, which improves the memory's bandwidth by allowing parallel write and read operations. This is possible due to the separated write and read ports inside the memory cell (WWL, WBL for write, and RWL, RBL for read).

It is expected that during the life of a patent maturing from this application many relevant memory cells, memory cell arrays, bitcells, gain-cells, gain-cell arrays, transistors, low threshold voltage transistors, regular threshold voltage transistors, embedded DRAMs, highly-scaled CMOS technologies, sense amplifiers, read decoders, write decoders, level shifters, drivers and level-shifting drivers will be developed and the scope of the terms memory cell, memory cell array, bitcell, gain-cell, gain-cell array, transistor, low threshold voltage transistor, regular threshold voltage transistor, embedded DRAM, highly-scaled technology, sense amplifier, read decoder, write decoder, level shifter, driver and level-shifting write drivers is intended to include all such new technologies a priori.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find calculated and experimental support in the following examples.

EXAMPLES

Reference is now made to the following examples, which together with the above descriptions illustrate some embodiments of the invention in a non limiting fashion.

Memory Macro Architecture

Reference is now made to FIG. 7, which is a simplified circuit diagram of a 4 kb (128×32) GC-eDRAM memory macro based on the 4T Mixed-VT bitcell, according to an exemplary embodiment of the invention. It is noted that the low threshold voltage marking (Low-$V_{TH}$) shown in FIG. 3 is not explicitly shown for each mixed-VT gain cell in the FIG. 7 memory cell array.

Memory macro 700 is a GC-eDRAM array implementation in a 28 nm bulk CMOS technology. This memory may be used for conventional applications, but by reducing the refresh rate it is especially well suited for applications that tolerate a certain percentage of errors in its embedded intermediate memory. Using an array of the 4T mixed-VT bitcell described herein, the array achieves a significantly higher DRT than other GC-eDRAM topologies in the same technology node, and is capable of operation at 800 MHz, which is higher than any other reported GC-eDRAM implementation. This is achieved with an almost 30% area advantage over a 6T SRAM in the same technology.

The increased DRT provided by the 4T mixed-VT gain-cell enables the integration of GC-eDRAM technology in light of scaling. This is demonstrated by FIG. 6, which shows estimated retention time distributions for 2T gain-cells at 65 nm and 28 nm and for a 4T gain-cell at 28 nm. FIG. 6 demonstrates that the effective DRT (EDRT) [10] of a conventional 2T bitcell degrades from the 65 nm to 28 nm node by more than an order-of-magnitude. In memory macro 700, this degradation is recovered by the memory cell of 4T mixed-VT gain-cell, as shown by the EDRT distributions of the three options (2T@65 nm, 2T@28 nm, and 4T@28 nm). The distributions were extracted from 1000 Monte-Carlo (MC) simulations including mismatch and global variations under worst case biasing conditions, where WBL is driven to the opposite level of SN.

The global level shifting signal (e.g. WE_Shifted in FIG. 7) is a function of the write enable (WE) signal and is evaluated in parallel with the decoder delay (which is a function of WADDR).

A. Write/Read Operations

For write, the WWL of the selected row is charged to a boosted voltage (VBOOST) to overcome the VT drop when writing '1' through an NMOS device.

The write port includes a write decoder, and level-shifting write drivers (each including a respective level-shifter, pre-WWL driver and WWL driver). Both the pre-WWL and WWL drivers are implemented with thick-oxide I/O devices to avoid oxide breakdown; however, the structure of the pre-WWL drivers limits the boosted signals in the array to the selected WWL and the boosted write enable (WE Shifted) net, driven by a shared level shifter (dashed line in FIG. 7). The write enable (WE) signal discharges WE Shifted to cut off the pull-up path of the pre-WWL drivers, while enabling the pull-down path of the selected pre-WWL driver. This toggles the selected WWL driver to assert WWL and transfer the Data In (DI) inputs to the SNs of the selected row.

During read, the RBL is precharged to VDD and the RWL of the selected row is discharged, conditionally discharging the RBL if the cell holds '1'.

The read port includes a read decoder, RWL drivers, RBL precharge devices, and sense inverters. When the read enable (RE) input is low, all RBLs are precharged to VDD. The rising-edge of RE cuts off the RBL precharge and simultaneously drives the selected RWL low. A stored '1' causes RBL to discharge through the RWL driver, while RBL stays high for a '0'. While a sense inverter is commonly used as a sense circuit in GC-eDRAM designs due to its reduced area and its simplicity, it suffers from very long read access times due to the slow decay of RBL. Therefore, a sense amplifier with an external VREF voltage was implemented to enable faster evaluation of the voltage at RBL. The sense amplifier enable (SAE) signal was implemented with a programmable delay line to enable adjustment according to the selected memory frequency.

Implementation and Measurement Results

A. Implementation

FIG. 8 shows layout views of an embodiment of an NMOS 4T mixed-VT bitcell, a 6T SRAM cell, both implemented in a 28 nm bulk CMOS technology, and a GC-eDRAM array of 4T mixed-VT bitcells. The 4T mixed-VT bitcell, measured at 0.4 µm×0.63 µm (0.252 µm²), features WBL and RBL lines routed in M2, RWL and VDD lines routed in M3, and a WWL routed in poly. Minimum sized devices were used for the implementation of the 4T cell, composed of two low-VT transistors (NF and NR) and two RVT transistors (NW and NB). A redrawn 6T SRAM in the same technology node was measured at 0.26 µm×1.3 µm (0.338 µm2), 34% larger than the NMOS 4T mixed-VT bitcell.

The 4 kb 4T mixed-VT NMOS GC-eDRAM memory macro has a silicon footprint of 31 µm×65 µm. For comparison, a similar sized, single-port SRAM macro, with "pushed-rule" bitcell layout, has a total silicon footprint of 42 µm×68 µm, which is over 40% larger than the memory macro. The memory macro contains two (write and read) row decoders, WWL level shifters, sense amplifiers, and all necessary BL and WL drivers.

A micrograph of the 28 nm test chip is shown in FIG. 9, along with key features of the implemented 4T mixed-VT NMOS GC-eDRAM memory macro. The test chip implements a test setup, including a phase lock loop (PLL), on-chip memory built-in self-test (BIST) and direct test-access modes to the memory macro. The memory BIST is configured through a serial interface (IF), readily available on the chip with the addressing mode, write pattern, number of idle memory cycles, and other configuration parameters. In addition, the memory may be accessed directly through the serial IF for debug.

B. Measurement Results

The test chips were packaged and connected to a field-programmable gate array (FPGA) evaluation board to communicate with the serial interface. All 10 packaged chips were fully operational across the complete range of supply voltages from 0.6V to 1V, which were the minimum and maximum voltages that are supported by the test setup. At the nominal technology supply voltage of 0.9V the memory was successfully operated at the entire frequency range from 100 MHz to 800 MHz, which is faster than other known GC-eDRAM memories.

FIG. 10 shows the measured retention time maps of the 4 kb 4T gain-cell array, operated at an 800 MHz clock frequency and a 0.9V supply voltage at temperatures of 0° C., 27° C. and 85° C. VBOOST and VREF were set to 1.2V and 0.8V respectively.

All measurements were performed under worst-case biasing conditions for both storage states and the results reflect the lower DRT of the two levels for each cell. As expected, the DRT decreases with temperature due to the increase in leakage currents. While the average DRT of the array at 85° C. is 250 µs, the DRT distribution is spread across three orders of magnitude, resulting in a worst-case DRT of almost 1 µs. The retention power, which is the sum of the leakage and refresh power of the 4 kb memory macro for a 5 µs retention time at 85° C. is found at 45 µW, with the refresh power constituting 80% of the total retention power.

A comparison between memory macros based on the 4T mixed-VT bitcell described herein and other logic-compatible embedded memory structures is provided in FIG. 11. These other memory structures are based on an asymmetric 2T gain-cell [3], a conventional 2T gain-cell [2], a 3T gain-cell [4], and a 6T SRAM cell. For fair comparison, the other gain-cell implementations are compared both based on their original implementation technology, and simulated results at a 28 nm node. While the 2T and 3T gain-cell structures provide lower area than the 4T mixed-VT bitcell, their DRT at a 28 nm node is highly decreased, residing below 100 ns. On the other hand, the proposed cell has a 5 µs DRT at 85° C., while also providing the highest operating speed compared to other gain-cell implementations. The 4T mixed-VT bitcell has an almost 30% lower cell area, as compared to a redrawn SRAM cell with logic design rules, as well as a 30% lower macro area compared to an SRAM macro with a "pushed-rule" layout. Moreover, it consumes over 50× less bitcell leakage power than a conventional 6T cell.

The DRT obtained for the implemented array may be considered small for memory applications for instruction or data caches, however it is acceptable for applications which are inherently fault tolerant with relaxed reliability requirements. To evaluate the benefits of exploiting the inherent error-resilience of such applications, FIG. 12 shows the cumulative distribution function of the DRT across temperatures, as extracted from the measured chips. The results indicate that the 4T GC-eDRAM array may be operated with a refresh rate of 5 µs with 99% of the bits providing reliable data retention (93% memory availability).

To enable visual evaluation of the GC-eDRAM array, the effect of the approximate storage on image data is demonstrated in FIG. 13, based on the measured DRTs. FIG. 13 shows the errors in the picture stored in the array under different refresh rates, ranging from 1 µs to 50 µs, with corresponding refresh power components of 179 µW to 3 µW, respectively. The average output peak signal to noise ratios (PSNR) were found at 66.1 dB, 59.2 dB, 52.3 dB, and 14.8 dB for refresh rates of 1 µs, 5 µs, 10 µs, and 50 µs, respectively. The image shows more erroneous pixels as the refresh period is extended, trading off accuracy for power savings and array availability.

In summary, embodiments of the invention offer improved memory density and power, with a reliability which may be tolerated by approximate computing applications. The exemplary memory presented herein is a 4T mixed-$V_T$ gain-cell implementation in a 28 nm logic process. The memory macro operates at an 800 MHz frequency, more than any other gain-cell implementation in literature. Moreover, it provides almost 30% lower area compared to a conventional, single-ported, SRAM. The array may be operated with a 5 µs retention time with a 99% yield, suitable for approximate storage systems.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A high-density memory comprising:
    a data write interface adapted to input data written to said memory;
    a data read interface adapted to output data read from said memory;
    an array of memory cells associated with said data write interface and said data read interface, adapted to store data input at said data write interface and to output stored data to said data read interface, each of said memory cells comprising at least one low threshold voltage read transistor and at least one regular threshold voltage transistor having a larger threshold voltage than a threshold voltage of said low threshold voltage read transistor, so as to obtain high-speed read operations; and
    level-shifting write drivers associated with said array of memory cells, adapted to supply shifted write wordline voltages to said array, so as to obtain high-speed write operations,
    wherein said memory cells are scaled below 65 nanometers.

2. A high-density memory according to claim 1, further comprising a shared level shifter adapted to supply a boosted voltage to said write drivers.

3. A high-density memory according to claim 1, further comprising at least one high-speed differential sense amplifier adapted to detect a logic level of an output data signal based on a comparison with a reference voltage.

4. A high-density memory according to claim 1, further adapted to predecode address signals so as to reduce propagation delay.

5. A high-density memory according to claim 1, adapted for operation at above 500 MHz.

6. A high-density memory according to claim 1, adapted for operation over a temperature range of 0-85° C.

7. A high-density memory according to claim 1, adapted for operation at supply voltages from near-threshold voltage to nominal voltage.

8. A high-density memory comprising:
    a data write interface adapted to input data written to said memory;
    a data read interface adapted to output data read from said memory;
    an array of memory cells associated with said data write interface and said data read interface, adapted to store data input at said data write interface and to output stored data to said data read interface, each of said memory cells comprising at least one low threshold voltage read transistor and at least one regular threshold voltage transistor having a larger threshold voltage than a threshold voltage of said low threshold voltage read transistor, so as to obtain high-speed read operations; and
    level-shifting write drivers associated with said array of memory cells, adapted to supply shifted write wordline voltages to said array, so as to obtain high-speed write operations,
    wherein said memory comprises separate write and read paths.

9. A high-density memory comprising:
    a data write interface adapted to input data written to said memory;
    a data read interface adapted to output data read from said memory;
    an array of memory cells associated with said data write interface and said data read interface, adapted to store data input at said data write interface and to output stored data to said data read interface, each of said memory cells comprising at least one low threshold voltage read transistor and at least one regular threshold voltage transistor having a larger threshold voltage than a threshold voltage of said low threshold voltage read transistor, so as to obtain high-speed read operations; and
    level-shifting write drivers associated with said array of memory cells, adapted to supply shifted write wordline voltages to said array, so as to obtain high-speed write operations,
    further comprising at least one high-speed differential sense amplifier adapted to detect a logic level of an output data signal based on a comparison with a reference voltage,
    wherein said reference voltage is configurable.

10. A high-density memory comprising:
    a data write interface adapted to input data written to said memory;
    a data read interface adapted to output data read from said memory;
    an array of memory cells associated with said data write interface and said data read interface, adapted to store data input at said data write interface and to output stored data to said data read interface, each of said memory cells comprising at least one low threshold voltage read transistor and at least one regular threshold voltage transistor having a larger threshold voltage than a threshold voltage of said low threshold voltage read transistor, so as to obtain high-speed read operations; and
    level-shifting write drivers associated with said array of memory cells, adapted to supply shifted write wordline voltages to said array, so as to obtain high-speed write operations,
    further comprising high-speed wordline drivers comprising respective pull-down devices, so as to enhance read speed.

11. A high-density memory comprising:
    a data write interface adapted to input data written to said memory;
    a data read interface adapted to output data read from said memory;
    an array of memory cells associated with said data write interface and said data read interface, adapted to store data input at said data write interface and to output stored data to said data read interface, each of said memory cells comprising at least one low threshold voltage read transistor and at least one regular threshold voltage transistor having a larger threshold voltage than a threshold voltage of said low threshold voltage read transistor, so as to obtain high-speed read operations; and level-shifting write drivers associated with said array of memory cells, adapted to supply shifted write wordline voltages to said array, so as to obtain high-speed write operations, wherein said level shifting is performed in parallel with decoder delay so as to reduce propagation delay.

* * * * *